US006444918B1

(12) United States Patent
Umemura

(10) Patent No.: US 6,444,918 B1
(45) Date of Patent: Sep. 3, 2002

(54) INTERCONNECTION STRUCTURE OF SEMICONDUCTOR ELEMENT

(75) Inventor: Eiichi Umemura, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/892,995

(22) Filed: Jun. 28, 2001

(30) Foreign Application Priority Data

Feb. 14, 2001 (JP) ........................................ 2001-036673

(51) Int. Cl.[7] ................................................ H05K 1/00
(52) U.S. Cl. ........................ 174/250; 174/262; 174/265; 361/803
(58) Field of Search ................................. 361/766, 779, 361/780, 762, 794, 795, 803; 174/250, 256, 261, 262, 265; 257/700–703; 333/12, 33, 246–247; 365/51–52, 63

(56) References Cited

U.S. PATENT DOCUMENTS

| 5,320,894 A | * | 6/1994 | Hasegawa | 174/250 |
| 5,519,176 A | * | 5/1996 | Goodman et al. | 174/250 |
| 5,627,345 A | * | 5/1997 | Yamamoto et al. | 174/257 |
| 6,172,305 B1 | * | 1/2001 | Tanahashi | 174/255 |
| 6,246,014 B1 | * | 6/2001 | Poomer | 174/254 |

FOREIGN PATENT DOCUMENTS

| JP | 7-245307 | 9/1995 |
| JP | 10-135298 | 5/1998 |
| JP | 11-67761 | 3/1999 |
| WO | WO97/10614 | 3/1997 |

* cited by examiner

Primary Examiner—Karnard Cuneo
Assistant Examiner—Tuan Dinh
(74) Attorney, Agent, or Firm—Volentine Francos, PLLC

(57) ABSTRACT

An interconnection structure comprises: an interlayer insulating film; and first interconnection layer to which low potential is applied and second interconnection layer to which high potential is applied when the interconnection structure is used, formed with the interlayer insulating film therebetween; and a via hole formed in the interlayer insulating film for electrically connecting the first interconnection layer and second interconnection layer. Overlap regions including regions of the first interconnection layer and the second interconnection layer faced said via hole are formed for both the first interconnection layer and second interconnection layer. The shortest distance from the edge of the via hole contact region to the end of the interconnection in the overlap region of the first interconnection layer is greater than the shortest distance from the edge of the via hole contact region to the interconnection end in the overlap region of the second interconnection layer, and is no more than 50 $\mu$m. Also, the interconnection resistance of the first interconnection layer is greater than the interconnection resistance of the second interconnection layer.

6 Claims, 14 Drawing Sheets

Distance (along the length of the interconnection)

Distance(along the length of the interconnection)

Distance (along the length of the interconnection)

Distance (along the length of the interconnection)

Distance (along the length of the interconnection)

Distance (along the length of the interconnection)

Distance (along the length of the interconnection)

Distance (along the length of the interconnection)

INTERCONNECTION STRUCTURE OF SEMICONDUCTOR ELEMENT

BACKGROUND OF THE INVENTION

1. Field of the Invention

The present invention relates to an interconnection structure used in semiconductor elements, and more particularly to a multilayer interconnection structure.

2. Description of Related Art

FIG. 1 shows a typical constitution of an interconnection structure wherein the upper interconnection layer and lower interconnection layer are electrically connected through a via hole.

Referring to FIG. 1, the lower interconnection layer 102 is formed on a substrate 100. An interlayer insulating film 104 is formed on the upper surface of the substrate 100 so as to cover this lower interconnection layer 102. The upper interconnection layer 106 is formed on the interlayer insulating film 104. The via hole 108 is formed in the interlayer insulating film 104. The upper interconnection layer 106 and lower interconnection layer 102 are electrically connected through the via hole 108. The inner walls of the via hole 108 are generally covered with a barrier metal 110. For example, tungsten (W) 112 is laid on the surface of the barrier metal 110 and the interior of the hole 108.

The following structures are known as the upper interconnection layer 106 and lower interconnection layer 102 respectively: a two-layered structure of Al (aluminum) alloy layer and high melting point metal layer formed as a barrier metal which having a melting point higher than that of the Al alloy, or a three-layered structure of the Al alloy layer held between the high melting point metal layers. In the example shown in FIG. 1, the upper interconnection layer 106 and lower layer interconnection 102 are the three-layered structure. Consequently, the lower interconnection layer 102 has a structure wherein the Al alloy layer 116 is held between the high melting point metal layer 120a and 120b. The upper interconnection layer 106 has a structure wherein the Al alloy layer 114 is held between the high melting point metal layers 118a and 118b.

SUMMARY OF THE INVENTION

The interconnection structure according to the present invention comprises an interlayer insulating film, first interconnection layer provided on one surface thereof and second interconnection layer on the other surface thereof. The interlayer insulating film has formed therethrough a via hole. Voltage is applied to the interconnection to become the first interconnection lower potential, the second interconnection higher potential. The first interconnection layer and second interconnection layer are established with the interlayer insulating film interposed therebetween and are electrically connected through the via hole.

An overlap region including the region facing (or in contact with) the via hole is formed in both the first interconnection and second interconnection layers. In other words, this overlap region is the region where the first interconnection and second interconnection layers overlap with the interlayer insulating film therebetween and the via hole is formed in the interlayer insulating film within this region.

A barrier metal is formed in the first interconnection layer and/or the second interconnection layer, in order to prevent from moving metal atoms between the interconnection layers. In this type of interconnection structure, the shortest distance from the edge of the via hole-faced (or contact) region of the overlap region of the first interconnection layer to the end of that interconnection is no more than 50 µm and is longer than the shortest distance from the edge of the via hole contact region of the overlap region of the second interconnection layer to the end of that interconnection. The interconnection resistance of the first interconnection layer is greater than the interconnection layer resistance of the second interconnection layer.

When voltage is applied to this interconnection structure so that the first interconnection layer is at a low potential and the second interconnection layer is at a high potential, the amount of Joule heating due to the current flow is greater in the first interconnection layer than in the second interconnection layer within the range of the interconnection thickness used in ordinary LSI chips, because the interconnection resistance of the first interconnection layer is greater than that of the second interconnection layer. Accordingly, the temperature of the first interconnection layer becomes greater than that of the second interconnection layer. As a result, the temperature of the overlap region of both sets of interconnection layers (perimeter of the via hole-faced (or contact) region) becomes high temperature and the temperature in the region of the second interconnection layer (except overlap region) becomes low temperature. Consequently, the temperature gradient at the boundary between the overlap region and the second interconnection layer becomes large.

The migration velocity of the metal forming the interconnection (also called "interconnection metal") changes exponentially relative to the temperature. In the interconnection structure, the migration velocity in the overlap region (high temperature region) is high and the migration velocity in the region of the second interconnection layer (low temperature region) is low. Consequently, the migration velocity drops abruptly because of the large temperature gradient at the boundary between the overlap region and the second interconnection layer. Accordingly, the vicinity of the above-mentioned boundary, wherein the temperature gradient is large, becomes a barrier to migration. Effects which are substantially the same as backflow effects can thereby be attained with this barrier. Accordingly, the progression of voids, due to movement of the interconnection metal in the vicinity of the boundary, can be suppressed. Consequently, the EM resistance of this interconnection layer structure can be improved.

The shortest distance from the edge of the via hole contact region of the overlap region of the first interconnection layer to the end thereof is greater than the shortest distance from the edge of the via hole contact region of the overlap region of the second interconnection layer to the end thereof. As a result, heat generated in the first interconnection layer can be conducted efficiently to the second interconnection layer in the overlap region of the first and second interconnection layers. Since the shortest distance from the edge of the via hole contact region of the overlap region of the first interconnection layer to the end thereof is no more than 50 µm, the boundary of the overlap region and the region of second interconnection layer only can be established at a position such that void progression can be suppressed at an early stage.

BRIEF DESCRIPTION OF THE DRAWINGS

The foregoing and other objects, features and advantages of the present invention will be better understood from the following description taken in connection with the accompanying drawings, in which.

DESCRIPTION OF THE PREFERRED EMBODIMENTS

Figure 1:
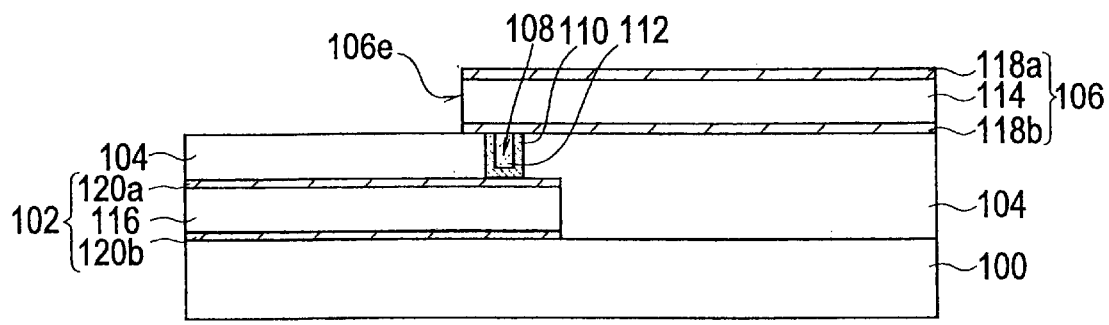
FIG. 1 is a schematic diagram of the constitution of the interconnection structure of the related art in a section through a line running along the length of the interconnection layer.

With reference to the drawings, embodiments of the present invention will be explained below. Moreover, it should be noted that these drawings show an outline of shapes, sizes, and arrangement of the constituent elements only to an extent necessary for appreciating the present invention and consequently, the present invention is not limited to the examples shown in the drawings. In the drawings, hatching (slanted lines) showing cross sections is omitted from all but certain sections. In the plane views, hatching is used in regions indicating specific constituent elements in order to make the positional relationships between the constituent elements easy to understand. In the following description, an interconnection layer may be called "interconnection" for short.

First Embodiment

Figure 2A:
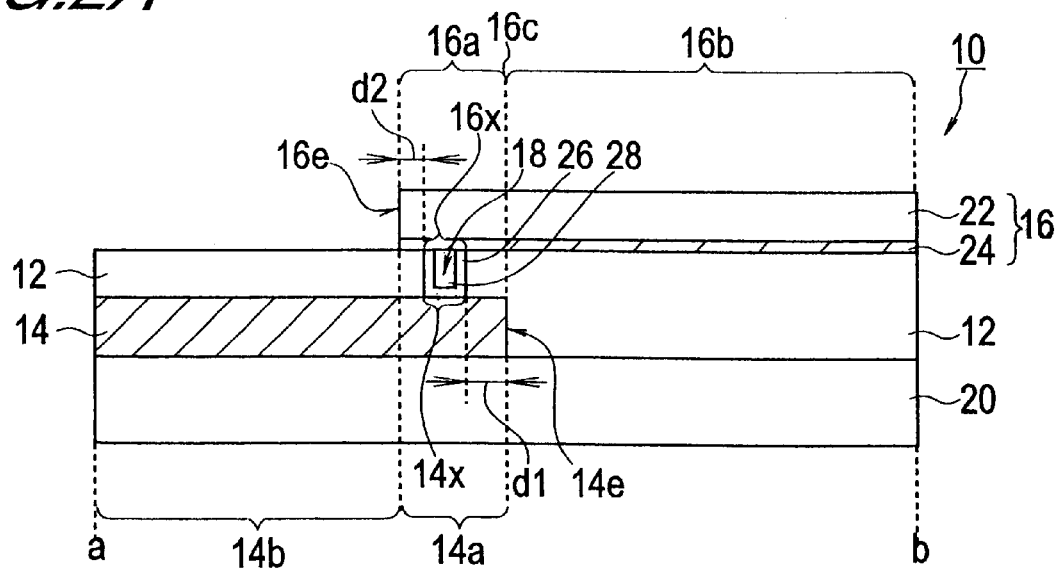
FIG. 2A is a schematic diagram of the constitution of the interconnection structure relating to the first embodiment of the present invention in a section through a line running along the length of the interconnection layer.
Figure 2B:
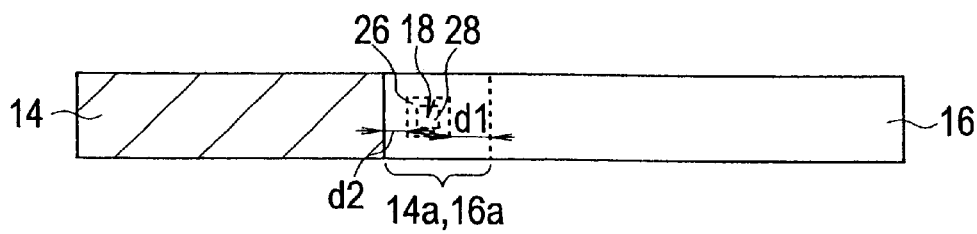
FIG. 2B is a schematic plane view of the disposition of the interconnection layer in the interconnection structure seen from above.
Figure 2C:
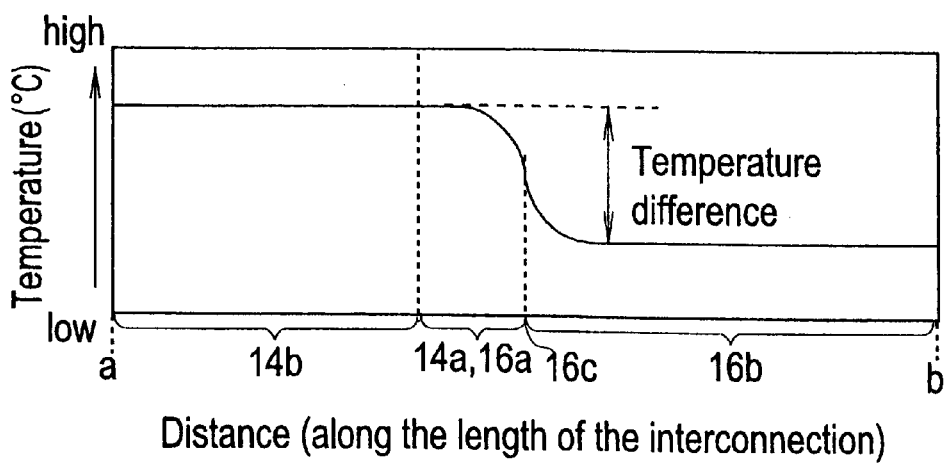
FIG. 2C is a temperature profile along the length of the interconnection layer during use of the interconnection structure relating to the first embodiment of the present invention.

The interconnection structure relating to a first embodiment will be explained with reference to FIGS. 2A to 2C. FIG. 2A is a cross sectional view of a section along a line in the direction in which migration progresses (along the length of an interconnection layer). FIG. 2B is a schematic plane view of the disposition of the interconnection in the interconnection structure seen from above. FIG. 2C is a temperature profile of the interconnection in the case of current flowing in the interconnection structure in FIG. 2A. In FIG. 2C, the horizontal axis shows the distance along the length of the interconnection and the vertical axis shows the interconnection temperature. The distance on the horizontal axis in FIG. 2C corresponds to the distance from position a to position b in FIG. 2A.

The interconnection structure 10 relating to the present invention comprises an interlayer insulating film 12, first interconnection layer 14 and second interconnection layer 16. The interlayer insulating film 12 has formed therethrough a via hole 18. The first interconnection layer 14 and second interconnection layer 16 are formed with the interlayer insulating film 12 interposed therebetween; the interconnection layers 14 and 16 are electrically connected by the via hole 18. Voltage is applied to the first interconnection layer 14 such that the potential is low when the interconnection structure 10 is used. Voltage is applied to the second interconnection layer 16 such that the potential is high when the interconnection structure 10 is used. Overlap regions 14a and 16a, including via hole contact regions 14x and 16x, are formed in the first interconnection layer 14 and second interconnection layer 16, respectively. The via hole contact regions mean the regions facing the via hole and is called the via hole-faced regions.

In the present embodiment, the first interconnection layer 14 is formed on the semiconductor substrate 20. The interlayer insulating film 12 is formed on the semiconductor substrate 20 so as to cover the first interconnection layer 14. The second interconnection layer 16 is formed on the upper surface of the interlayer insulating film 12. The first interconnection layer 14 is constituted with a high melting point metal (here, "high melting point" means that the melting point is greater than that of aluminum) that does not include aluminum (Al). In this example, the first interconnection layer 14 is single-metal interconnection of tungsten (W). The second interconnection layer 16 is layered interconnection comprising an upper layer 22 constituted by an alloy layer containing Al as the principal interconnection material (also called an Al alloy layer) and a lower layer 24 constituted by a high melting point metal as a barrier metal. In this example, the lower layer 24 is constituted with a TiN film. The inner walls of the via hole 18 are covered with the barrier metal 26. Furthermore, the interior of the via hole 18 is filled with tungsten (W) 28.

In the overlap regions 14a and 16a of the first interconnection layer 14 and second interconnection layer 16, the shortest distance d1 from the edge of the via hole contact region 14x of the first interconnection layer 14 to the interconnection end 14e is greater than the shortest distance d2 from the edge of the via hole contact region 16x of the second interconnection layer 16 to the interconnection end 16e. d1 is no more than 50 μm (see FIGS. 2A and 2B).

d1 is longer than d2 so that heat may be conducted efficiently from the first interconnection layer 14 with high interconnection resistance, through the via hole 18, to the second interconnection layer 16. d1 is no more than 50 μm so that the boundary 16c between the overlap region 16a of the second interconnection layer 16 and the region 16b of only the second interconnection layer is formed at a position such that void progression can be suppressed at an early stage.

Voltage is applied to this interconnection structure 10 so that the first interconnection layer 14 is at a low potential and the second interconnection layer 16 is at a high potential. Because the first interconnection layer 14 is constituted with tungsten (W) having a higher melting point than aluminum, the amount of Joule heating due to current is greater in the first interconnection layer 14 than in the second interconnection layer 16. Consequently, as shown in FIG. 2C, the temperature of the region 14b of only the first interconnection layer becomes high. Heat generated in the first interconnection layer 14 is conducted from the overlap region 14a of the first interconnection layer to the via hole 18. This heat is conducted to the second interconnection layer 16, also through the interlayer insulating film 12. For this reason, the temperature of the overlap region 16a of the second interconnection layer 16 also rises. In the second interconnection layer 16, the temperature of the region 16b outside the overlap region, is low. In this case, the temperature distribution from the overlap region 14a of the first interconnection layer in a direction towards the overlap region 16a of the second interconnection layer is as follows. From the starting point of the overlap region 14a to the end point of the overlap region 14a, the temperature gradually falls and the temperature gradient is maximum in the vicinity of that end point. In the second interconnection layer region, the temperature falls with increasing distance from the overlap region 16a and gradually becomes a uniform temperature lower than that of the first interconnection layer.

When current flows in the interconnection structure 10, migration of Al occurs within the second interconnection layer 16. Voids are thus created from one end 16e of the second interconnection layer 16 and the voids progress towards the other end.

The migration velocity of the Al changes exponentially in relation to temperature.

In the second interconnection layer 16, as discussed above, the temperature gradient in the vicinity of the boundary 16c between the overlap region 16a and the region 16b outside the overlap region is maximum.

Consequently, this temperature gradient can be used as a barrier to migration. In other words, because the migration velocity becomes high in high-temperature regions and the migration velocity is low in low temperature regions, the migration velocity of the Al can be abruptly reduced in the vicinity of the above-mentioned boundary 16c. Since this is substantially the same effect as the backflow effect, this can suppress void progression. As a result, an increase in interconnection resistance can be suppressed. Consequently, this interconnection structure 10 can have improved EM resistance compared to conventional structures.

FIRST EXAMPLE

Here, a first example is provided as a specific example of the first embodiment and the effects are shown more clearly through comparison with a comparative example.

Figure 3:
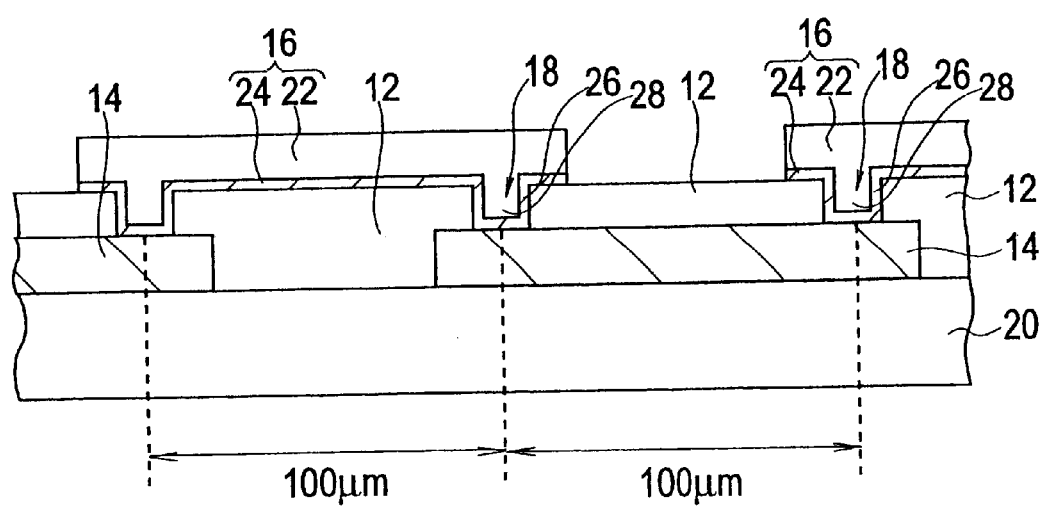
FIG. 3 is a schematic diagram showing cross section of the interconnection structure relating to the first embodiment of the present invention.

FIG. 3 shows the constitution of the interconnection in the first example. Referring to FIG. 3, as explained with the first embodiment, the tungsten (W) film is formed as the first interconnection layer 14 on the semiconductor substrate 20. The interlayer insulating film (for example, an $SiO_2$ film) 12 is formed so as to cover the first interconnection layer 14. Layered interconnection of a TiN film 24 and an Al alloy layer 22 is formed as the second interconnection layer 16 on the upper surface of the interlayer insulating film 12. Here, the second interconnection layer 16 is formed in connection with the via hole 18. The inner walls of the via hole 18 and the lower layer of the second interconnection layer 16 are covered with the TiN films 24 and 26 of a barrier metal. The material embedded or buried in the via hole 18 and the upper layer of the second interconnection layer connected thereto is constituted with Al alloy layers 22 and 28. Due to the presence of the barrier metal 24 and 26, the interconnection metal (for example, Al) does not migrate from the second interconnection layer 16 to the first interconnection layer 14.

Here, the interval between the via holes 18 in the interconnection structure relating to the first embodiment is 100 μm.

Figure 4:
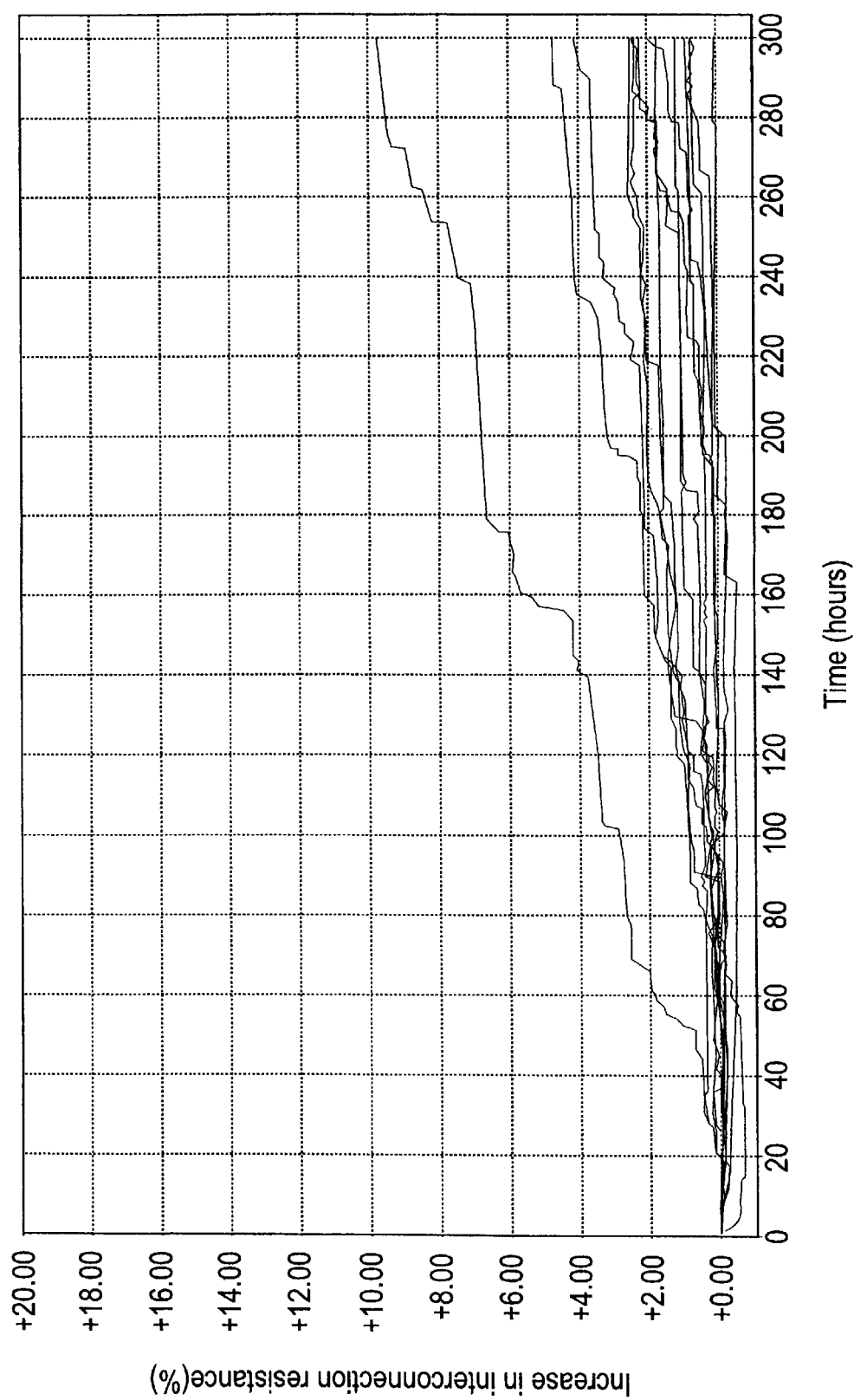
FIG. 4 is a diagram of the properties showing measured results from the first embodiment of the present invention.

Current was passed through this type of interconnection structure under the following test conditions: J (current density) of $2 \times 10^6$ A/cm$^2$ and T (interconnection temperature) of 200° C. Current was applied for 300 hours. The interconnection resistance of the entire interconnection structure at the start of current application was measured as $R_0$ and the interconnection resistance at any time up to 300 hours as R. FIG. 4 shows these measurement results. In FIG. 4, the passage of time (0 to 300 hours) is shown on the horizontal axis and the percentage increase in interconnection layer resistance at any time with respect to the interconnection resistance at the start of current application ($R/R_0 \times 100(\%)$) is shown on the vertical axis.

Moreover, FIG. 4 shows the results of conducting the same type of measurements on a plurality of interconnection structures having the same constitution as the first example.

Comparative Example

The example for comparison with the first example will be explained next with reference to FIGS. 5 and 6.

Figure 5:
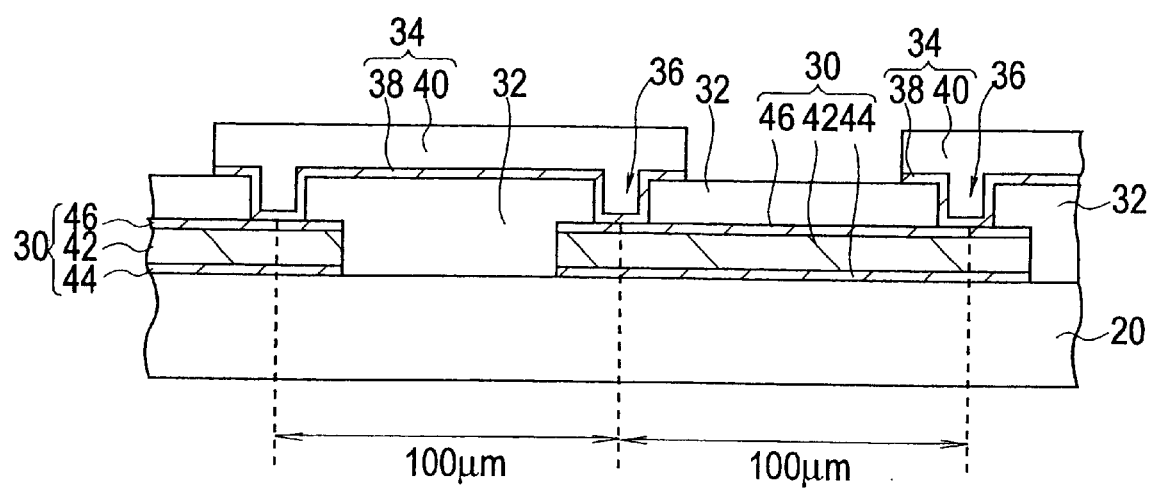
FIG. 5 is a schematic diagram of the constitution of the interconnection structure relating to a comparative example.

FIG. 5 is an example of the constitution of an interconnection structure according to art relating to the present invention. The first interconnection layer 30 is formed on the semiconductor substrate 20. The interlayer insulating film 32 is formed so as to cover this first interconnection layer 30. The second interconnection layer 34 is formed on the interlayer insulating film 32. A via hole 36 for electrically connecting the second interconnection layer 34 and first interconnection layer 30 is formed in the interlayer insulating film 32. The interval between the via holes is 100 μm as in the first example. The second interconnection layer 34 is formed integrally with the via hole 36, as in the first example. In other words, the inner walls of the via hole 36 and the lower layer of the second interconnection layer 34 are covered with a TiN film 38 of a barrier metal. The material embedded or buried in the via hole and the upper layer of the second interconnection layer 34 is formed with an Al alloy layer 40. In this way, the principal constitution of the interconnection structure is the same as in the first example, but in the comparative example, the first interconnection layer comprises layered interconnection of an Al alloy layer 42 and barrier metal (TiN film) 44 and 46 with this Al alloy layer 42 therebetween.

Measurements were made of this interconnection structure relating to the comparative example under the same conditions as for the first example.

Figure 6:
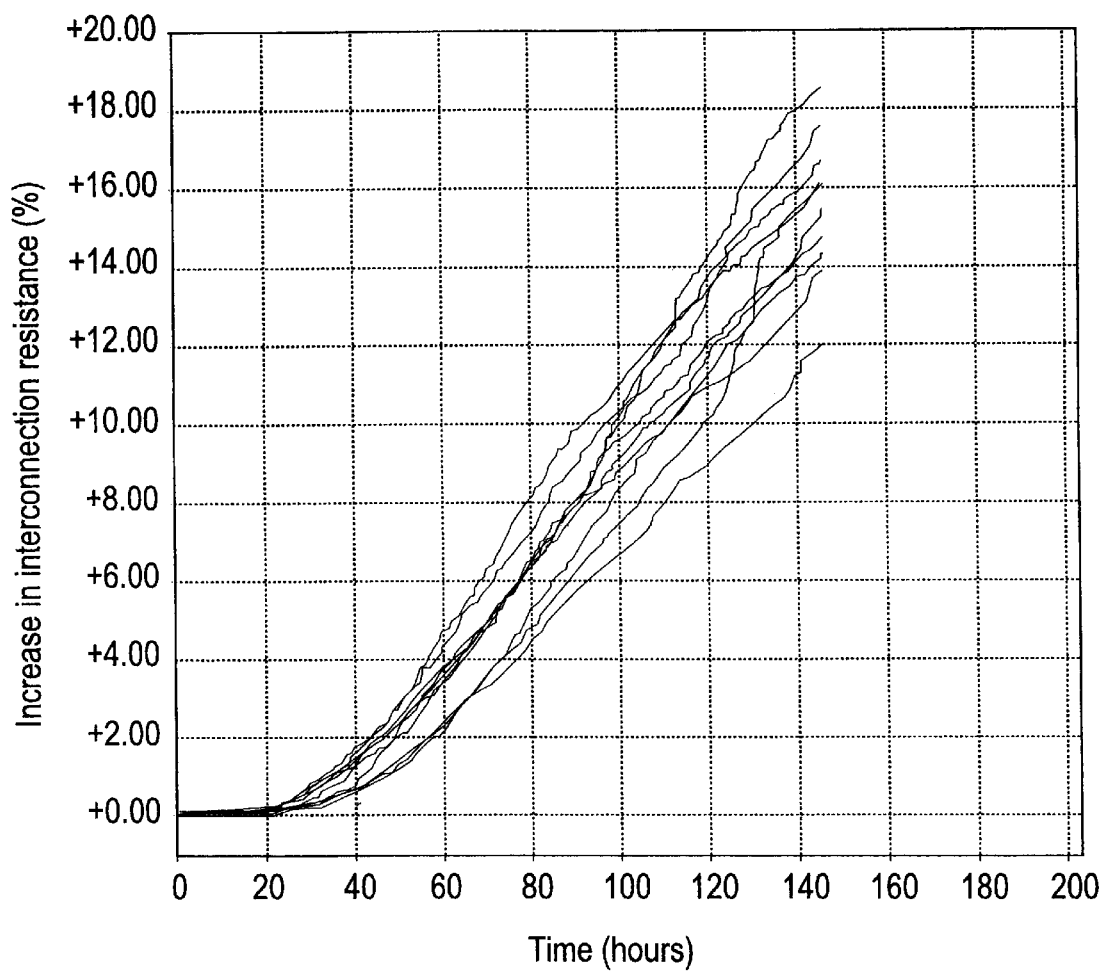
FIG. 6 is a diagram of the properties showing measured results from the comparative example.

FIG. 6 shows the measurement results. In FIG. 6, the passage of time (0 to 200 hours) is shown on the horizontal axis and the percentage of the interconnection resistance (R) at any time with respect to the interconnection resistance at the start of current application ($R_0$) ($R/R_0 \times 100(\%)$) is shown on the vertical axis. As with the first example, FIG. 6 shows the results of conducting the same type of measurements on a plurality of interconnection structures having the same constitution as the comparative example.

The measurement results for the first example and the measurement results for the comparative example are compared with reference to FIGS. 4 and 6.

As a result, in the interconnection structure relating to the first example, the percentage increase in interconnection resistance even after 300 hours was 10% or less, while in the interconnection structure relating to the comparative example, the percentage increase in interconnection resistance for the entire interconnection structure exceeded 10% after 140 hours.

For the interconnection structure in the first example, the percentage increase in interconnection resistance could be kept to one half or less that of the interconnection resistance of the interconnection structure in the comparative example. In other words, it could be confirmed that a great improvement in the EM resistance of the interconnection was contrived with the interconnection structure relating to the present invention.

Second Embodiment

The interconnection structure 50 relating to a second embodiment will be explained with reference to FIGS. 7A to 7C. The principal constitution of the interconnection structure 50 is the same as in the first embodiment. In this example, the width (w1) of the first interconnection layer 14 is made narrower than the width (w2) of the second interconnection layer 16 for increasing the interconnection resistance of the first interconnection layer 14.

Points at variance with the first embodiment are explained next; a detailed explanation of similar points is omitted.

Figure 7A:
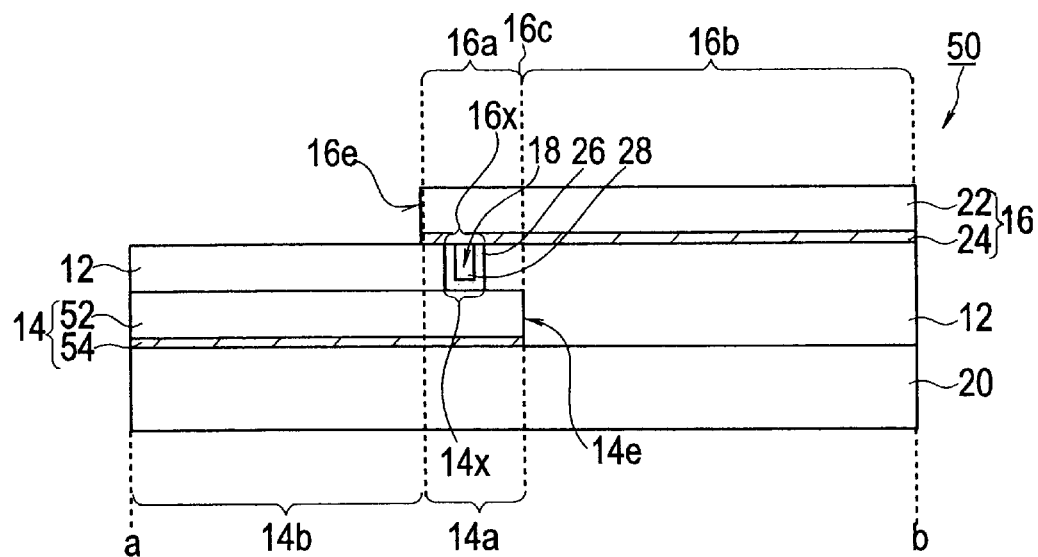
FIG. 7A is a schematic diagram of the constitution of the interconnection structure relating to a second embodiment of the present invention in a cross section through a line running along the length of an interconnection layer.
Figure 7B:
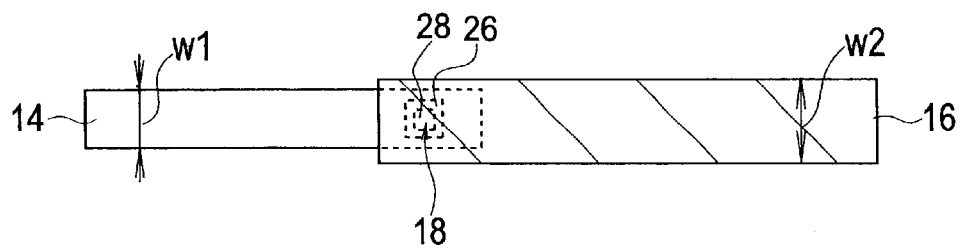
FIG. 7B is a schematic plane view of the constitution of the interconnection structure seen from above.
Figure 7C:
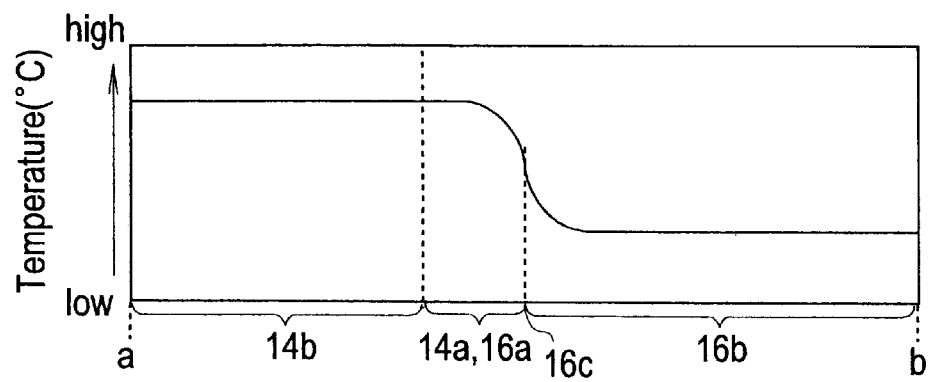
FIG. 7C is a temperature profile along the length of the interconnection layer during use of the interconnection structure relating to the second embodiment of the present invention.

FIGS. 7A, 7B and 7C are a cross sectional view, plane view and temperature profile, respectively, of the interconnection structure 50 like those shown in FIGS. 2A, 2B and 2C, respectively. Specifically, FIG. 7C is a temperature profile in the case of passing current through the interconnection structure relating to this embodiment. The distance on the horizontal axis in FIG. 7C corresponds to the distance from position a to position b in FIG. 7A.

Referring to FIG. 7A, the interconnection structure 50 in the present embodiment has the first interconnection layer 14 formed on the semiconductor substrate 20 as in the first embodiment. The interlayer insulating film 12 is formed on the semiconductor substrate 20 so as to cover this first interconnection layer 14. The second interconnection layer 16 is formed on the upper surface of the interlayer insulating film 12. The via hole 18 is formed in the interlayer insulating film 12 in overlap regions 14a and 16a of the first interconnection layer 14 and second interconnection layer 16.

In this embodiment, the first interconnection layer 14 and second interconnection layer 16 are both layered interconnection of upper layers 52 and 22 comprising an alloy layer including Al and lower layers 54 and 24 comprising TiN film. The inner walls of the via hole 18 are covered with barrier metal 26. The interior of the via hole 18 is filled with tungsten (W) 28. The first interconnection layer 14 and second interconnection layer 16 are thereby electrically connected.

In this embodiment, as shown in FIG. 7B, the width (w1) of the first interconnection layer 14 is formed to be narrower than the width (w2) of the second interconnection layer 16. w1 is preferably from 10% to 80% of w2. Accordingly, a temperature difference between the overlap region 16a of the second interconnection layer 16 and the region 16b outside the overlap region can be produced in the case where current flows through the interconnection structure 50.

As in the first embodiment, voltage is applied to this interconnection structure 50 so that the first interconnection layer 14 is at a low potential and the second interconnection layer 16 is at a high potential. At this time, because the width (w1) of the first interconnection layer 14 is narrower than the width (w2) of the second interconnection layer 16, the interconnection resistance of the first interconnection layer 14 becomes greater than that of the second interconnection layer 16. As a result, the amount of Joule heating due to the current flow is greater in the first interconnection layer 14 than in the second interconnection layer 16 and therefore the interconnection temperature becomes higher in the first interconnection layer 14. Accordingly, as shown in FIG. 7C, in the overlap regions 14a and 16a of the first interconnection layer 14 and second interconnection layer 16, the temperature becomes high because heat is conducted from the first interconnection layer 14 through the via hole 18. Also, the heat is conducted through the interlayer insulating film 12 to the second interconnection layer 16. Meanwhile, the region 16b outside the overlap region of the second interconnection layer 16 is at a low temperature. Consequently, in the second interconnection layer 16, the temperature gradient in the vicinity of the boundary 16c between the overlap region 16a and the region 16b outside the overlap region is the maximum. In other words, the temperature distribution in the second embodiment is the temperature distribution as explained with the first embodiment.

When voltage is applied to (current flows through) this interconnection structure 50, migration of the Al atoms, that are the material constituting the interconnection, occurs. Because of this migration, voids occur at one end 16e of the second interconnection layer 16 and these voids progress towards the other end. In the second interconnection layer 16 in the present embodiment, as in the first embodiment, the migration velocity of the Al changes abruptly because of the temperature gradient (see FIG. 7C) of the boundary 16c between the overlap region 16a and the region 16b outside the overlap region. This temperature gradient therefore becomes a barrier to migration. Accordingly, the same type of effects as the backflow effect can be substantially achieved. Consequently, this interconnection structure 50 can have more than double the EM resistance of conventional structures.

Third Embodiment

The interconnection structure relating to a third embodiment will be explained with reference to FIGS. 8A and 8B. The principal constitution of the interconnection structure is the same as in the first embodiment. In this embodiment, the overlap region of the first interconnection layer is constituted with a metal having a higher melting point than the second interconnection layer.

Points at variance with the first and second embodiments are explained next; a detailed explanation of similar points is omitted.

Figure 8A:
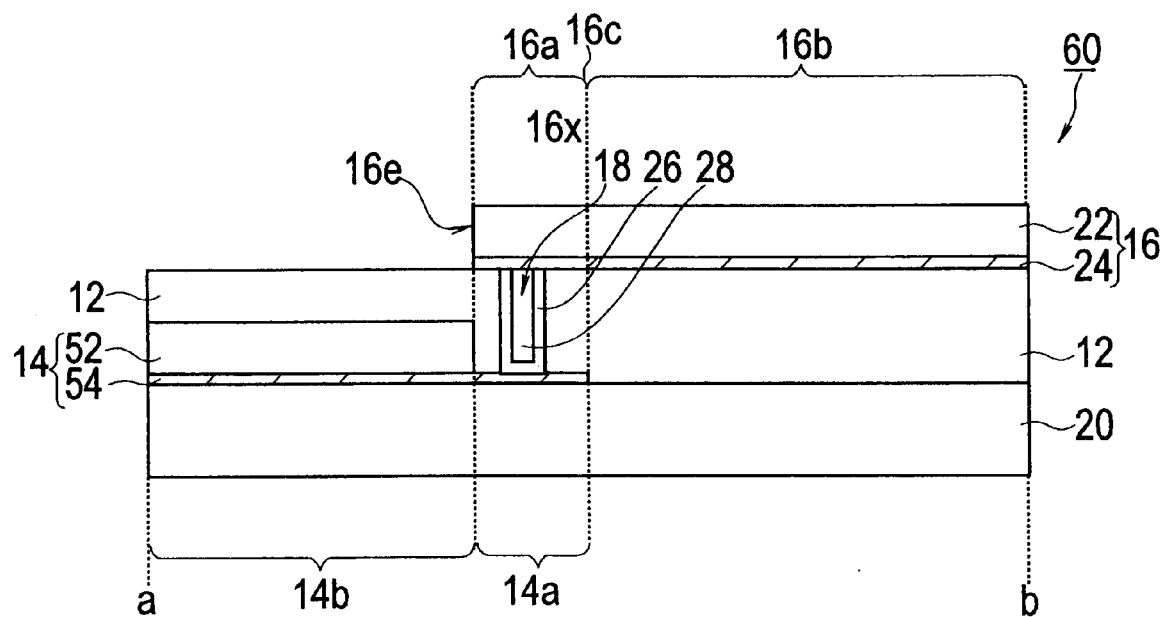
FIG. 8A is a schematic diagram of the constitution of the interconnection structure relating to a third embodiment of the present invention in a section through a line running along the length of an interconnection layer.
Figure 8B:
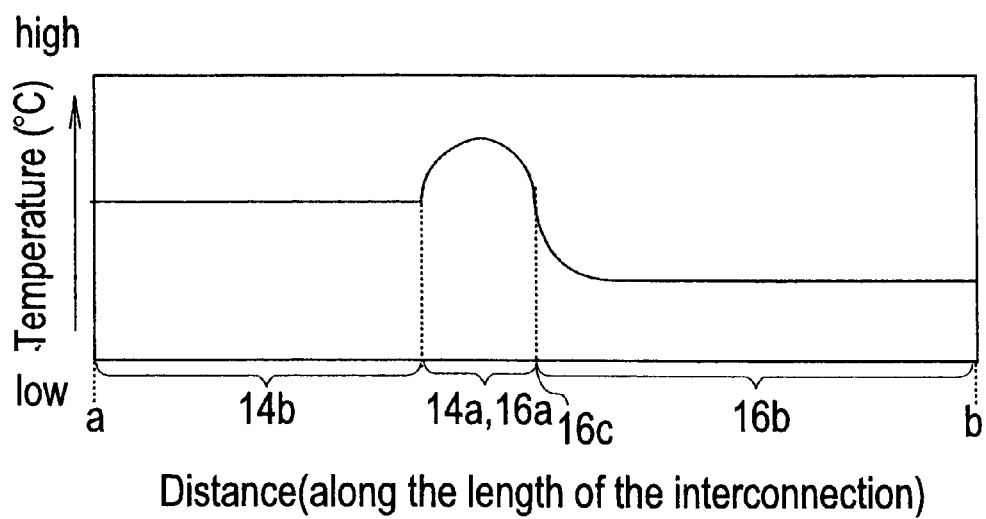
FIG. 8B is a temperature profile along the length of the interconnection layer during use of the interconnection structure relating to the third embodiment of the present invention.

FIGS. 8A and 8B are a cross sectional view and temperature profile, respectively, of the interconnection structure 50 like those shown in FIGS. 2A and 2C, respectively. The distance on the horizontal axis in FIG. 8B corresponds to the distance from position a to position b of the interconnection structure in FIG. 8A.

Referring to FIG. 8A, the interconnection structure 60 in the present embodiment has the first interconnection layer 14 formed on the semiconductor substrate 20 as in the first embodiment. The interlayer insulating film 12 is formed on the semiconductor substrate 20 so as to cover this first interconnection layer 14. The second interconnection layer 16 is formed on the upper surface of the interlayer insulating film 12. The via hole 18 is formed in the interlayer insulating film 12 in overlap regions 14a and 16a of the first interconnection layer 14 and second interconnection layer 16.

In this embodiment, the region 14b outside the overlap region of the first interconnection layer 14 and second interconnection layer 16, for example, are both layered interconnection of upper layers 52 and 22 comprising an alloy layer including Al and lower layers 54 and 24 comprising TiN film. The overlap region 14a of the first interconnection layer 14 is interconnection of only the lower layer 54 comprising TiN film. The overlap region 14a and region 14b outside the overlap region are connected by the lower layer 54 and have a constitution wherein the upper layer 52 is partially removed from only the overlap region 14a.

The inner walls of the via hole 18 are covered with barrier metal 26. The interior of the via hole 18 is filled with tungsten (W) 28. Consequently, the TiN film 54 of the first interconnection layer 14 and the lower layer 24 of the second interconnection layer 16 are in contact with the via hole 18.

As in the first embodiment, voltage is applied to the interconnection structure 60 so that the first interconnection layer 14 is at a low potential and the second interconnection layer 16 is at a high potential. The overlap region 14a of the first interconnection layer 14 is now constituted with only a TiN film 54. Consequently, the overlap region 14a has a higher interconnection resistance than the region 14b outside the overlap region, comprising the upper layer 52 and lower layer 54, and than the second interconnection layer 16. As a result, the amount of Joule heating occurring in the overlap region 14a of the first interconnection layer 14 becomes high. For this reason, the interconnection temperature of the overlap region 14a becomes high. This heat is conducted through the via hole 18 from the overlap region 14a of the first interconnection layer 14 to the overlap region 16a of the second interconnection layer 16. Consequently, a large temperature gradient (FIG. 8B) occurs at the boundary between the overlap region 16a and the region 16b outside the overlap region, because the overlap region 16a of the second interconnection layer 16 is at a high temperature. In other words, the temperature distribution in the overlap regions 14a and 16a from the first interconnection layer 14 towards the second interconnection layer 16 increases abruptly at the start of the overlap of the first interconnection layer 14 and second interconnection layer 16, becomes the maximum temperature (temperature gradient of 0) in the middle, and at the end of the overlap, becomes approximately equal to the temperature at the start of the overlap. The temperature gradient is maximum at the end of the overlap. With the increase in distance from the overlap region 16a, the temperature of the second interconnection layer drops and at the region 16b separated from the overlap region, becomes a constant temperature lower than the temperature of the portion 14b of the first interconnection layer.

When voltage is applied to this interconnection structure 60, migration of the Al atoms occurs in the upper layer 22 of the second interconnection layer 16. Due to this migration, voids occur at one end 16e of the second interconnection layer 16 and these voids progress towards the other end. In the present embodiment, the migration velocity of the Al drops abruptly at that boundary because of the temperature gradient of the boundary 16c between the overlap region 16a and the region 16b outside the overlap region. In this way, this temperature gradient becomes a barrier to migration. Accordingly, the same type of effects as the backflow effect can be substantially achieved. Consequently, this interconnection structure 60 can have better EM resistance than conventional structures.

Fourth Embodiment

The interconnection structure 70 relating to a fourth embodiment is explained next with reference to FIGS. 9A and 9B. The principal constitution of the interconnection structure 70 is the same as in the first embodiment. In this embodiment, the first interconnection layer 14 is made thinner than the second interconnection layer 16.

Points at variance with the first through third embodiments are explained next; a detailed explanation of similar points is omitted.

Figure 9A:
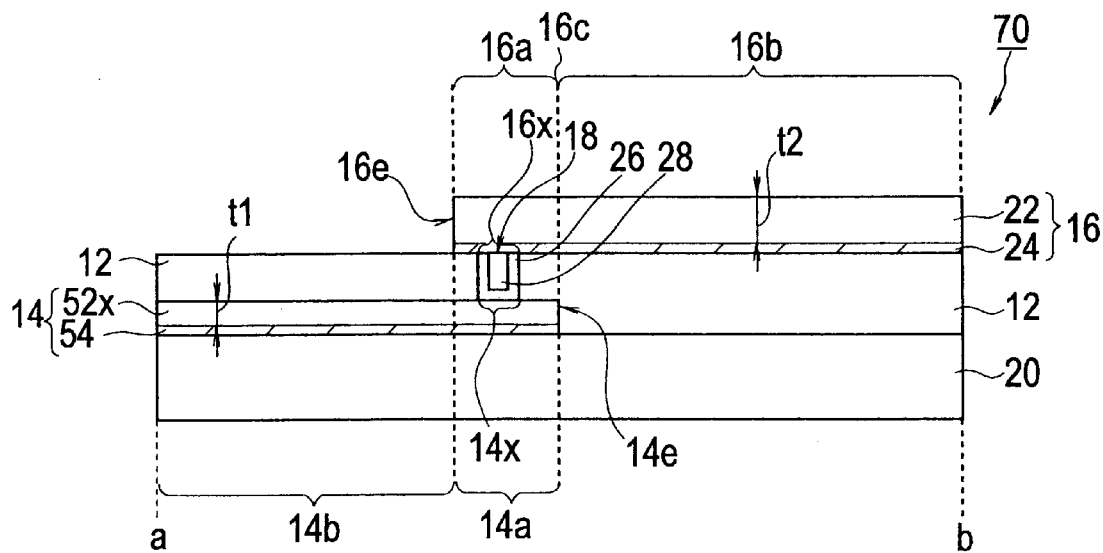
FIG. 9A is a schematic diagram of the constitution of the interconnection structure relating to a fourth embodiment of the present invention in a cross section through a line running along the length of an interconnection layer.
Figure 9B:
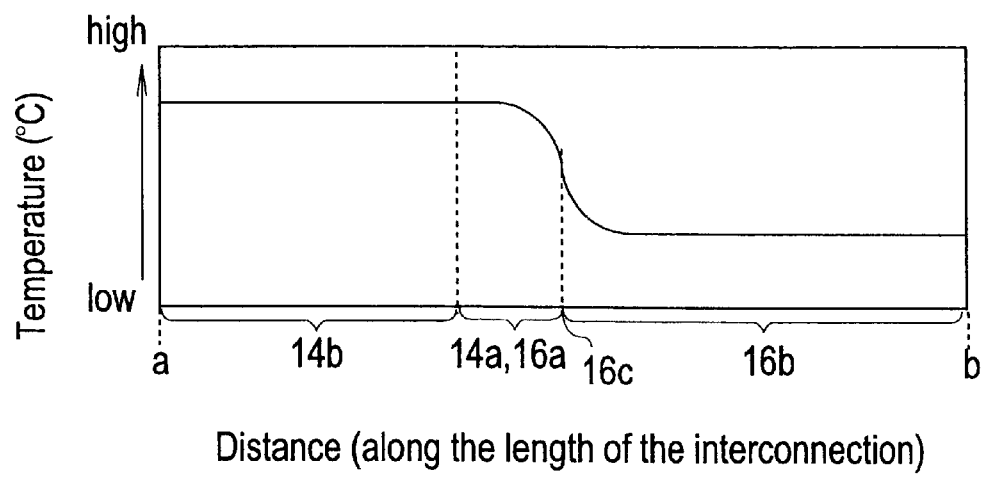
FIG. 9B is a temperature profile along the length of the interconnection layer during use of the interconnection structure relating to the fourth embodiment of the present invention.

FIGS. 9A and 9B show a diagram and temperature profile, respectively, which are similar to those shown in FIGS. 8A and 8B, respectively. The distance on the horizontal axis in FIG. 9B corresponds to the distance from position a to position b of the interconnection structure in FIG. 9A.

Referring to FIG. 9A, the interconnection structure 70 in the present embodiment has the first interconnection layer 14 formed on the semiconductor substrate 20 as in the first embodiment. The interlayer insulating film 12 is formed on the semiconductor substrate 20 so as to cover this first interconnection layer 14. The second interconnection layer 16 is formed on the upper surface of the interlayer insulating film 12. The via hole 18 is formed in the interlayer insulating film 12 in overlap regions 14a and 16a of the first interconnection layer 14 and second interconnection layer 16.

In this embodiment, for example, the first interconnection layer 14 and second interconnection layer 16 are both layered interconnection of upper layers 52x and 22 comprising an alloy layer including Al and lower layers 54 and 24 comprising TiN film. The inner walls of via hole 18 are covered with barrier metal 26. The surface of the barrier metal 26 in the via hole 18 is further filled with tungsten (W) 28. Accordingly, the first interconnection layer 14 and second interconnection layer 16 are electrically connected by means of the via hole 18.

In this embodiment, the thickness (t1) of the Al alloy layer 52x, which is the upper layer of the first interconnection layer 14, is formed to be thinner than the thickness (t2) of the Al alloy layer 22 of the second interconnection layer 16. The thickness (t1) of the Al alloy layer 52x of the first interconnection layer 14 is preferably from 10% to 80% of the thickness (t2) of the Al alloy layer 22 of the second interconnection layer 16. Accordingly, a temperature difference between the overlap region 16a of the second interconnection layer 16 and the region 16b outside the overlap region can be produced in the case where current flows through the interconnection structure 70.

As in the first embodiment, voltage is applied to this interconnection structure 70 so that the first interconnection layer 14 is at a low potential and the second interconnection layer 16 is at a high potential. At this time, because the first interconnection layer 14 is thinner than the second interconnection layer 16, the interconnection resistance of the first interconnection layer 14 becomes greater than that of the second interconnection layer 16. As a result, the amount of Joule heating due to the current flow is greater in the first interconnection layer 14 than in the second interconnection layer 16 and therefore the interconnection temperature becomes higher in the first interconnection layer 14. Accordingly, as shown in FIG. 9B, in the overlap regions 14a and 16a of the first interconnection layer 14 and second interconnection layer 16, the temperature becomes high because heat is conducted from the first interconnection layer 14 through the via hole 18. Meanwhile, the region 16b outside the overlap region of the second interconnection layer 16 is at a low temperature. Consequently, in the second interconnection layer 16, the temperature gradient in the vicinity of the boundary 16c between the overlap region 16a and the region 16b outside the overlap region becomes large. In this way, the same temperature distribution as in the case of the first embodiment is obtained in the case of the fourth embodiment.

Consequently, as in the first embodiment, the vicinity of the boundary 16c is a barrier to migration and therefore, the same type of effects as the backflow effect can also be achieved with the interconnection structure 70 relating to the fourth embodiment. Consequently, an interconnection structure 70 with EM resistance superior to that of conventional interconnection structures is obtained.

Fifth Embodiment

The interconnection structure 80 relating to a fifth embodiment is explained with reference to FIGS. 10A to 10C.

Figure 10A:
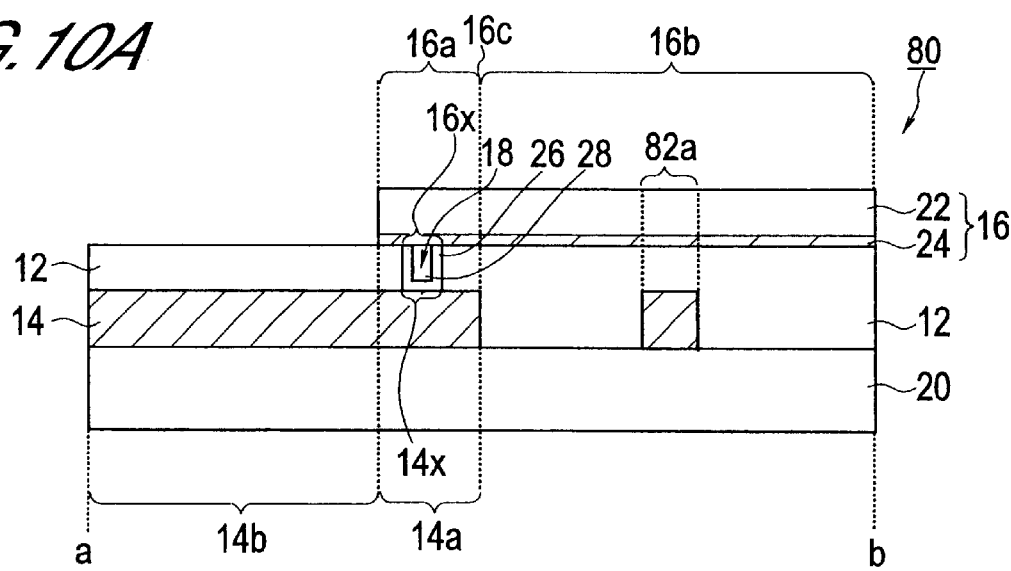
FIG. 10A is a schematic diagram of the constitution of the interconnection structure relating to a fifth embodiment of the present invention in a cross section through a line running along the length of an interconnection layer.
Figure 10B:
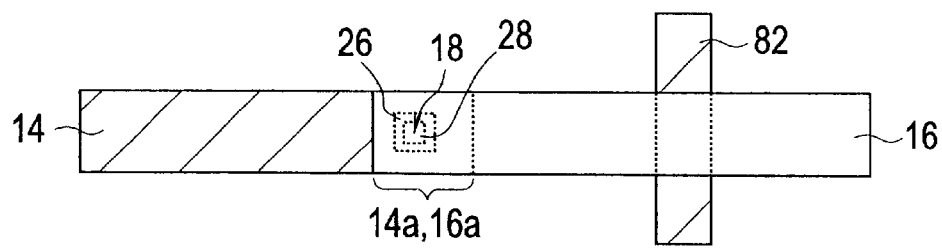
FIG. 10B is a schematic plane view of the constitution of the interconnection layer in the interconnection structure seen from above.
Figure 10C:
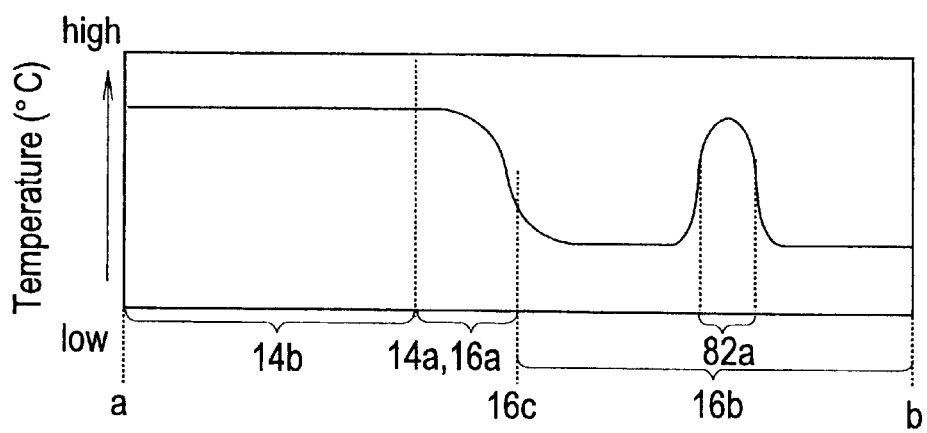
FIG. 10C is a temperature profile along the length of an interconnection layer during use of the interconnection structure relating to the fifth embodiment of the present invention.

FIGS. 10A, 10B and 10C are a cross sectional view, plane view and temperature profile, respectively, of the interconnection structure 50 which are similar to those shown in FIGS. 2A, 2B and 2C, respectively. Specifically, FIG. 10C is a temperature profile in the case of passing current through the interconnection structure relating to this embodiment. FIG. 10C is an interconnection temperature profile when using (applying voltage to) the interconnection structure 80 relating to this embodiment.

The interconnection structure 80 in the present embodiment comprises an interlayer insulating film 12, first interconnection layer 14 and second interconnection layer 16. The interlayer insulating film 12 has formed therethrough a via hole 18. The first interconnection layer 14 and second interconnection layer 16 are formed with the interlayer insulating film 12 interposed therebetween; the interconnections 14 and 16 are electrically connected by the via hole 18. The first interconnection layer 14 is the interconnection to which voltage is applied such that the potential is low when the interconnection structure 80 is used; and the second interconnection layer 16 is the interconnection to which voltage is applied such that the potential is high. Overlap regions 14a and 16a including via hole 18 contact regions 14x and 16x are formed in the first interconnection layer 14 and second interconnection layer 16, respectively.

In the present embodiment, the first interconnection layer 14 is formed on the semiconductor substrate 20, as in the first embodiment. The interlayer insulating film 12 is formed on the semiconductor substrate 20 so as to cover the first interconnection layer 14. The second interconnection layer 16 is formed on the upper surface of the interlayer insulating film 12.

As in the first embodiment, the first interconnection layer 14 is constituted with single-metal interconnection of tungsten (W), as the high melting point metal which does not include Al. The second interconnection layer 16 is layered interconnection comprising an upper layer 22 constituted by an alloy layer (Al alloy layer) including aluminum as the principal interconnection material and a lower layer 24 constituted with a high melting point metal (TiN film) of a barrier metal. The inner walls of the via hole 18 are covered with the barrier metal 26. The surface of the barrier metal 26 in this hole 18 is filled with tungsten (W) 28 (FIG. 10A).

So that heat can be applied to the second interconnection layer 16 at a position within 50 μm from the edge of the region 16x in contact with the via hole 18, heater line 82 is established and electrically insulated from the first interconnection layer 14 and second interconnection layer 16.

In the present embodiment, the heater line 82 is constituted with a layer of the same material as the first interconnection layer 14.

In the present embodiment, the heater line 82 comprising tungsten (W) is formed on the lower side, of the second interconnection layer 16, that is the upper surface of the semiconductor substrate 20. The heater line 82 is formed at a position no more than 50 μm from the via hole contact regions 14x and 16x of the first interconnection layer 14 and second interconnection layer 16. In this example, the heater line 82 is provided so that the length of this heater line 82 is perpendicular to the length of the second interconnection layer 16 (FIGS. 10A and 10B).

The position at which the heater line 82 is formed is no more than 50 μm from the edge of the via hole contact region 16x in order that the progression of voids in the second interconnection layer be suppressed within this distance. If this distance is no more than 50 μm, the increase in interconnection resistance of the second interconnection layer 16 can be kept within tolerance.

Voltage is applied to the interconnection structure 80 so that the first interconnection layer 14 is at a low potential and second interconnection layer 16 is at a high potential. In the present embodiment, current flows through the heater line 82 as well. Since the first interconnection layer 14 is constituted with tungsten (W) which is a high melting point metal, the interconnection resistance is higher than the second interconnection layer 16 which is constituted with a TiN film 24 and an Al alloy layer 22. For this reason, the interconnection temperature of the first interconnection layer 14 becomes greater than the interconnection temperature of the second interconnection layer 16 with the application of the above-mentioned voltage. The interconnection temperature of the heater line 82 becomes high because this interconnection is constituted with the same material as the first interconnection layer 14. When voltage is applied, the interconnection in the interconnection structure 80 is at a temperature like that above, and therefore the interconnection temperature characteristics as shown in FIG. 10C are attained. The horizontal axis in FIG. 10C shows the distance along the length of the interconnection. This distance corresponds to the distance from the position a to position b in FIG. 10A.

Referring to FIG. 10C, the region 14b and the overlap region 14a of the first interconnection layer 14 are high in temperature as in the first embodiment. The heat from the overlap region 14a of the first interconnection layer 14 is conducted to the overlap region 16a of the second interconnection layer 16 from the via hole 18; the overlap region 16a of the second interconnection layer 16 thereby also becomes high in temperature. Meanwhile, the region 16b outside the overlap region of the second interconnection layer 16 is low in temperature. The region 82a to which heat is conducted from the heater line 82 becomes high in temperature. Consequently, in the present embodiment, as in the first embodiment, the large temperature gradient is formed in the second interconnection layer 16 near the boundary 16c between the overlap region 16a and region 16b outside the overlap region. The temperature distributions of the first interconnection layer and second interconnection layer become the same distributions as in the case of the first embodiment in overlap regions 14a, 16a and the vicinity thereof. Furthermore, in this embodiment, in the region 82a to which heat is conducted from the heater line 82, a large temperature change occurs wherein the temperature becomes higher than in the surrounding region. Accordingly, this temperature gradient and region of temperature change are a two-stage barrier which reduces the velocity of the migration of Al produced in the upper layer 22 of the second interconnection layer 16. Consequently, because effects which are substantially the same as the backflow effect are imparted to the second interconnection layer 16, the increase in interconnection resistance is prevented because void progression can be suppressed and the EM resistance can be improved.

Sixth Embodiment

The interconnection structure 85 relating to a sixth embodiment will be explained with reference to FIGS. 11A to 11C.

Figure 11A:
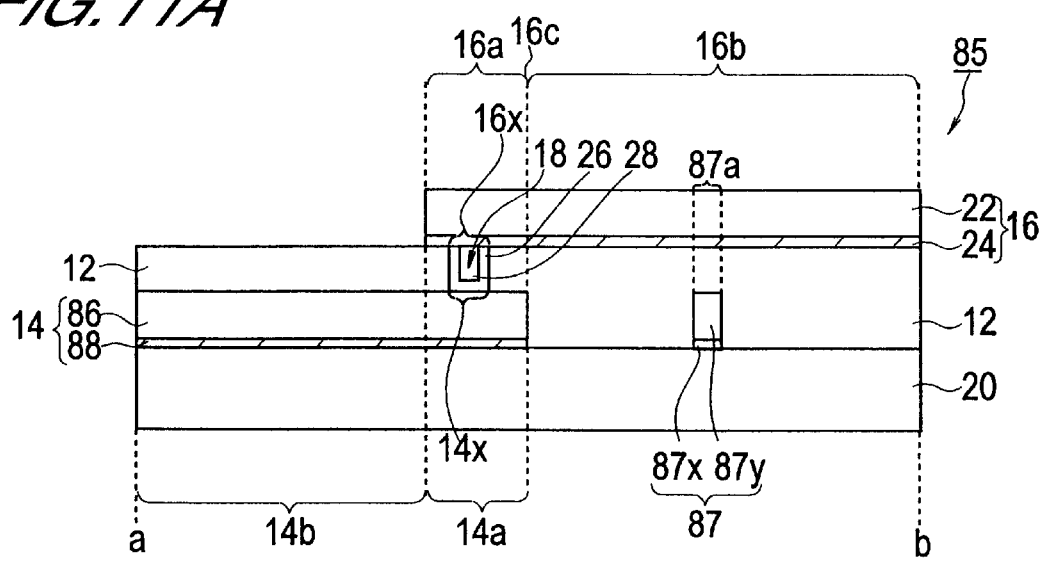
FIG. 11A is a schematic diagram of the constitution of the interconnection structure relating to a sixth embodiment of the present invention in a cross section through a line running along the length of an interconnection layer.
Figure 11B:
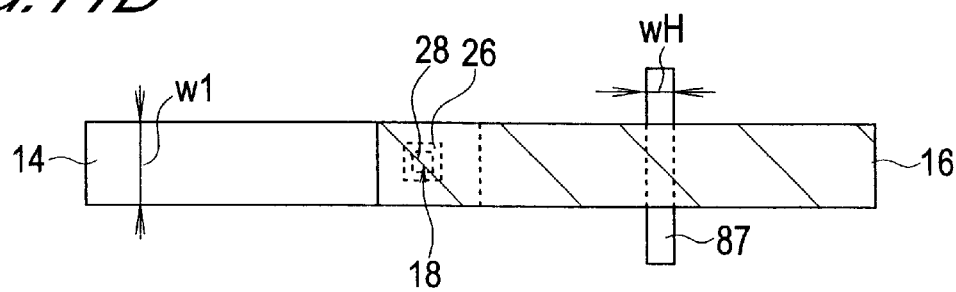
FIG. 11B is a schematic plane view of the constitution of the interconnection layer in the interconnection structure seen from above.
Figure 11C:
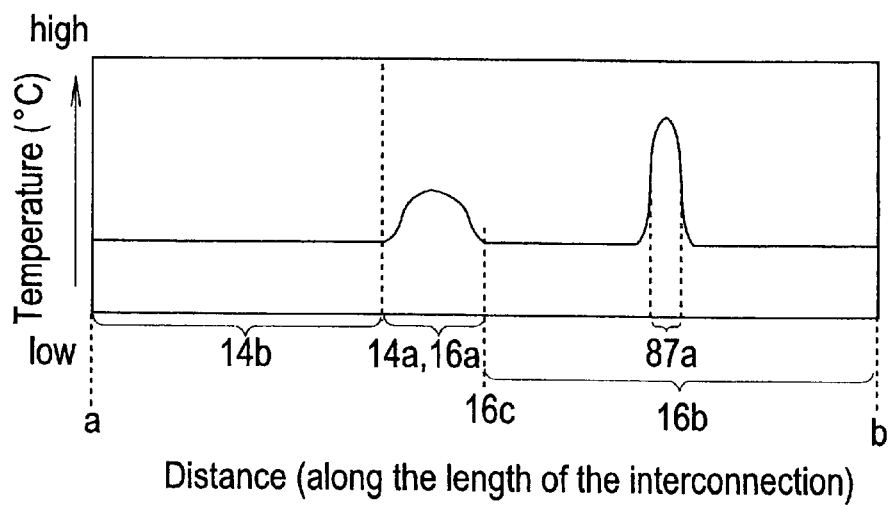
FIG. 11C is a temperature profile along the length of an interconnection layer during use of the interconnection structure relating to the sixth embodiment of the present invention.

FIGS. 11A, 11B and 11C are a cross sectional view, plane view and temperature profile, respectively, which are similar to those shown in FIGS. 10A, 10B and 10C, respectively.

The principal constitution of the interconnection structure 85 is the same as the conventional structure. Referring to the FIGS. 11A and 11B, the first interconnection layer 14 is formed on the semiconductor substrate 20. The interlayer insulating film 12 is formed on the semiconductor substrate 20 so as to cover this first interconnection layer 14. The second interconnection layer 16 is formed on the upper surface of the interlayer insulating film 12. The via hole 18, electrically connecting the first interconnection layer 14 and second interconnection layer 16, is formed in the interlayer insulating film 12. In this embodiment, the first interconnection layer 14 and second interconnection layer 16 are both layered interconnection of lower layers 88 and 24 comprising TiN film and upper layers 86 and 22 comprising an Al alloy layer. The inner walls of the via hole 18 are covered with the TiN film 26 of a barrier metal. The surface of the TiN film 26 in the via hole 18 is filled with tungsten (W) 28 (FIG. 11A).

In the present embodiment, as in the fifth embodiment, heater line 87 is formed and electrically insulated from the first interconnection layer 14 and second interconnection layer 16, so that heat can be applied to the second interconnection layer 16 at a position within 50 μm from the edge of the region 16x in contact with the via hole 18. The heater line 87 is constituted with a layer of the same material as the first interconnection layer 14 and second interconnection layer 16.

In the present embodiment, heater line 87 comprising a TiN film 87x and Al alloy layer 87y is formed on the lower side of the second interconnection layer 16 that is the upper surface of the semiconductor substrate 20 (see FIG. 11A). In the present embodiment, the width (wH) of this heater line 87 is made narrower than the width (w1) of the first interconnection layer 14 (see FIGS. 11A and 11B), and therefore the interconnection resistance of the heater line 87 is greater than the interconnection resistance of the first interconnection layer 14 and the second interconnection layer 16. Consequently, when voltage is applied to this interconnection structure 85 so that the first interconnection layer 14 and heater line 87 are at a low potential and the second interconnection layer 16 is at a high potential, the interconnection temperatures show the temperature characteristics as in FIG. 11C. The distance along the length of the interconnection on the horizontal axis in FIG. 11C corresponds to the distance from position a to position b in FIG. 11A.

Referring to FIG. 11C, the region 14b of only the first interconnection layer and the region 16b of only the second interconnection layer are at low temperatures. The overlap regions 14a and 16a of the first interconnection layer 14 and second interconnection layer 16 are at low temperatures; however, the heat generated in the first interconnection layer 14 is conducted to the second interconnection layer 16 through the via hole 18 and therefore the temperatures rise somewhat. Consequently, in this case, the temperature distributions of the overlap regions 14a and 16a themselves achieve the temperature distribution which is high in the central portions of the overlap regions, as in the description of the third embodiment. However, because the heater line 87 formed on the lower side of the second interconnection layer 16 is at a high temperature, the heat generated is conducted to the vicinity of the position where the second interconnection layer 16 is provided (a position no more than 50 μm from the via hole contact region 16x). As explained with the fifth embodiment, a region of great temperature change 87a is formed in the second interconnection layer 16 and therefore, this temperature change region 87a is a barrier which reduces the velocity of the migration of Al produced in the upper layer 22 of the second interconnection layer 16. Consequently, because effects which are substantially the same as the backflow effect can be imparted to the second interconnection layer 16, the increase in interconnection resistance is prevented because void progression can be suppressed and the EM resistance can be improved.

Seventh Embodiment

The interconnection structure 90 relating to a seventh embodiment will be explained with reference to FIGS. 12A and 12B.

Figure 12A:
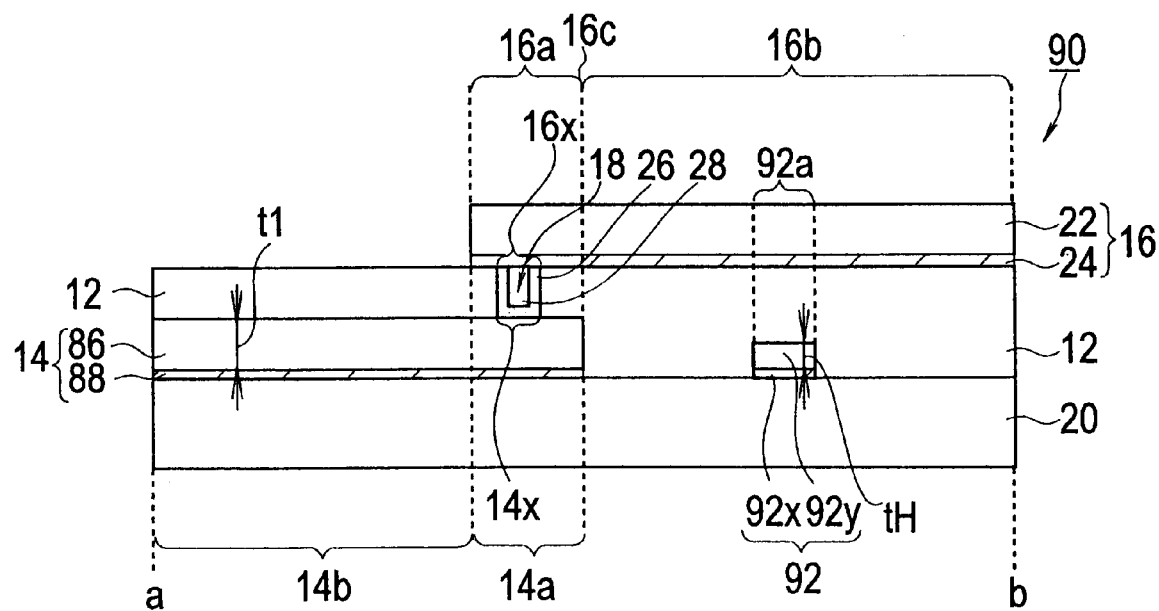
FIG. 12A is a schematic diagram of the constitution of the interconnection structure relating to a seventh embodiment of the present invention in a cross section through a line running along the length of an interconnection layer.
Figure 12B:
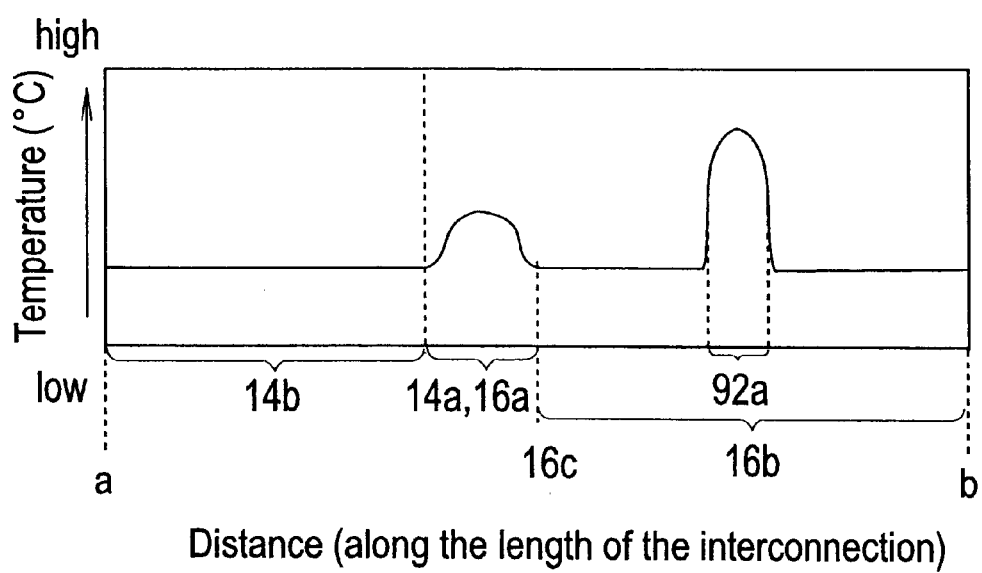
FIG. 12B is a temperature profile along the length of an interconnection layer during use of the interconnection structure relating to the seventh embodiment of the present invention.

FIGS. 12A and 12B are a cross sectional view and temperature profile, respectively, which are similar to those shown in FIGS. 11A and 11C, respectively.

The principal constitution of the interconnection structure is the same as the conventional structure. Referring to FIG. 12A, the first interconnection layer 14 is formed on the semiconductor substrate 20. The interlayer insulating film 12 is formed on the semiconductor substrate 20 so as to cover this first interconnection layer 14. The second interconnection layer 16 is formed on the upper surface of the interlayer insulating film 12. The via hole 18, electrically connecting the first interconnection layer 14 and second interconnection layer 16, is formed in the interlayer insulating film 12. In this embodiment, as in the sixth embodiment, the first interconnection layer 14 and second interconnection layer 16 are both layered interconnection of lower layers 88 and 24 comprising TiN film and upper layers 86 and 22 comprising an Al alloy layer. The inner walls of the via hole 18 are covered with the TiN film 26 of a barrier metal. The surface of the TiN film 26 of the inner walls of the via hole 18 is filled with tungsten (W) 28 (FIG. 12A).

In the present embodiment, as in the fifth embodiment, heater line 92 is established and electrically insulated from the first interconnection layer 14 and second interconnection layer 16, so that heat can be applied to the second interconnection layer 16 at position within 50 $\mu$m from the edge of the region 16x in contact with the via hole 18. The heater line 92 is constituted with a layer of the same material as the first interconnection layer 14 and second interconnection layer 16.

In the present embodiment, heater line 92 comprising a TiN film 92x and Al alloy layer 92y is formed on the lower side of the second interconnection layer 16 that is the upper surface of the semiconductor substrate 20 (FIG. 12A). This heater line 92 is thinner than the thickness of the first interconnection layer 14 (FIG. 12A). Specifically, the thickness (tH) of the Al alloy layer, which is the upper layer 92y of the heater line 92, is thinner than the thickness (t1) of the upper layer 86 of the first interconnection layer 14. Therefore the interconnection resistance of the heater line 92 is greater than the interconnection resistance of the first interconnection layer 14 and the second interconnection layer 16. Consequently, when voltage is applied to this interconnection structure 90 so that the first interconnection layer 14 and heater line 92 are at a low potential and the second interconnection layer 16 is at a high potential, current flows in the interconnection structure 90. The interconnection temperatures at this time show the temperature characteristics as in FIG. 12B. The distance along the length of the interconnection on the horizontal axis in FIG. 12B corresponds to the distance from position a to position b in FIG. 12A.

Referring to FIG. 12B, the same temperature distribution is attained as in the case of the sixth embodiment explained with reference to FIG. 1C. In other words, the region 14b of the first interconnection layer only and the region 16b of the second interconnection layer only are at low temperatures. Since some heat is conducted from the first interconnection layer 14 to the second interconnection layer 16 through the via hole 18, the temperature rises slightly in the overlap regions 14a and 16a of the first interconnection layer 14 and second interconnection layer 16. Because the heater line 92 formed on the lower side of the second interconnection layer 16 is at a high temperature due to large interconnection resistance, the heat generated there is conducted to the vicinity of the position where the second interconnection layer 16 is established (a position no more than 50 $\mu$m from the via hole contact region 16x). Because a region of great temperature change 92a is formed in the second interconnection layer 16, this temperature change region 92a provides a barrier which reduces the velocity of the migration of Al produced in the upper layer 22 of the second interconnection layer 16. Consequently, effects which are substantially the same as the backflow effect can be imparted to the second interconnection layer 16. Accordingly, the increase in interconnection resistance is prevented because void progression can be suppressed and the EM resistance can be improved.

Eighth Embodiment

The interconnection structure 95 relating to the eighth embodiment will be explained with reference to FIGS. 13A to 13C.

Figure 13A:
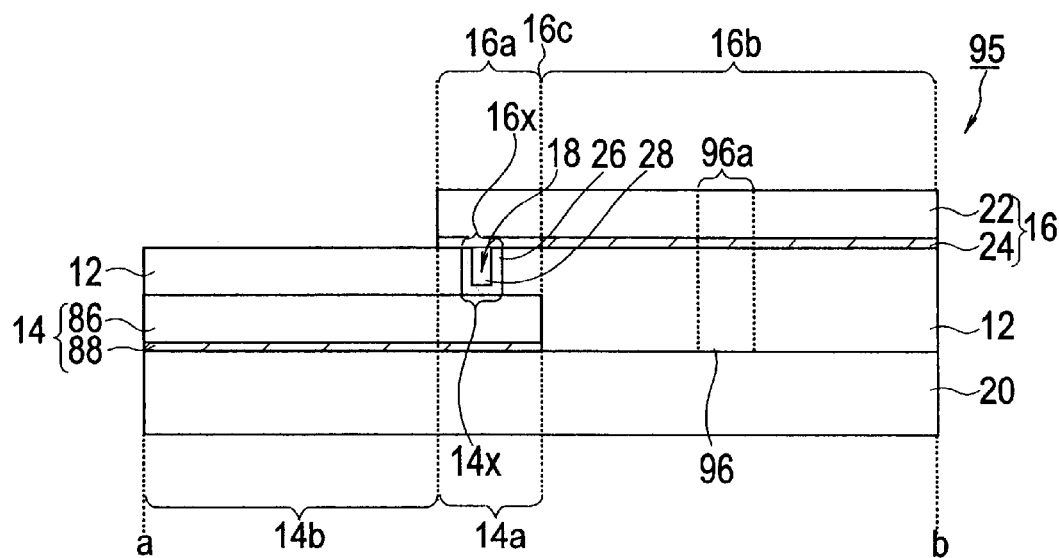
FIG. 13A is a schematic diagram of the constitution of the interconnection structure relating to an eighth embodiment of the present invention in a cross section through a line running along the length of an interconnection layer.
Figure 13B:
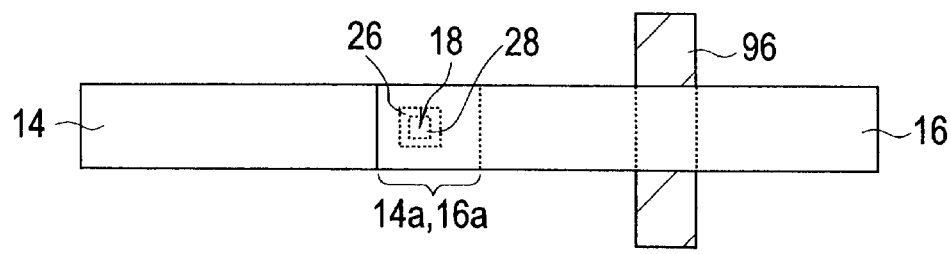
FIG. 13B is a schematic plane view of the constitution of the interconnection layer in the interconnection layer structure seen from above.
Figure 13C:
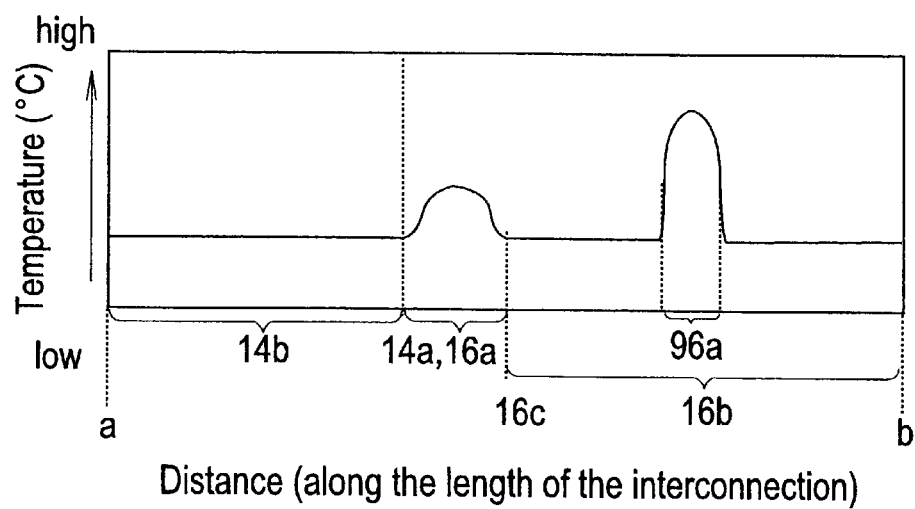
FIG. 13C is a temperature profile along the length of an interconnection layer during use of the interconnection structure relating to the eighth embodiment of the present invention.

FIGS. 13A, 13B and 13C show a diagram, plane view and temperature profile, respectively, which are similar to those shown in FIGS. 11A, 11B and 11C, respectively.

The principal constitution of the interconnection structure 95 is similar to the conventional structure. In FIGS. 13A and 13B, the first interconnection layer 14 is formed on the semiconductor substrate 20. The interlayer insulating film 12 is formed on the semiconductor substrate 20 so as to cover this first interconnection layer 14. The second interconnection layer 16 is formed on the upper surface of the interlayer insulating film 12. The via hole 18, electrically connecting the first interconnection layer 14 and second interconnection layer 16, is formed in the interlayer insulating film 12. In this embodiment, as in the sixth embodiment, the first interconnection layer 14 and second interconnection layer 16 are both layered interconnection of lower layers 88 and 24 comprising TiN film and upper layers 86 and 22 comprising an Al alloy layer. The inner wall of the via hole 18 is covered with the TiN film 26. The surface of the TiN film 26 in the via hole 18 is filled with tungsten (W) 28 (FIG. 13A).

In the present embodiment, as in the fifth embodiment, heater line 96 is provided, while being electrically insulated from the first interconnection layer 14 and second interconnection layer 16, at a position on the semiconductor substrate 20 where the heater line 96 can heat the second interconnection layer 16, and that is a position separated from the edge of the region 16x in contact with the via hole 18 by a distance of 50 $\mu$m. In the present embodiment, the heater line 96 is formed as a layer of a high melting point metal having a melting point higher than that of Al. Consequently, the TiN film used as the lower layers 88 and 24 of the first interconnection layer 14 and second interconnection layer 16 is formed, as the heater line 96, on the lower side of the second interconnection layer 16 that is the upper surface of the semiconductor substrate 20 (FIG. 13A). The heater line 96 is formed on the substrate 20 so that the longitudinal direction thereof is orthogonal to the direction along the length of the interconnection (FIG. 13B).

Consequently, since the interconnection resistance of the heater line 96 is greater than the interconnection resistance of the first interconnection layer 14 and second interconnection layer 16, current flows through the interconnection structure 95 when a voltage is applied to this interconnection structure 95 so that the first interconnection layer 14 and heater line 96 are at a low potential and the second interconnection layer 16 is at a high potential. The interconnection temperature at this time shows the temperature characteristics as in FIG. 13C. The distance along the length of the interconnection on the horizontal axes in FIG. 13C corresponds to the distance from position a to position b in FIG. 13A.

Referring to FIG. 13C, the same temperature distribution as explained with the sixth and seventh embodiments is attained. In other words, the region 14b of the first interconnection layer only and the region 16b of the second interconnection layer only are at low temperatures. In the overlap regions 14a and 16a of the first interconnection layer 14 and second interconnection layer 16, the temperature rises by a certain extent since the heat is conducted from the first interconnection layer 14 to the second interconnection layer 16 through the via hole 18. Since the heater line 96 formed on the lower side of the second interconnection layer 16 is at a high temperature because of its large interconnection resistance, the heat generated there is conducted to the vicinity of the position where the second interconnection layer 16 is provided (position separated from the via hole 18 contact region 16x by a distance of 50 $\mu$m or less), and a region of great temperature change 96a is formed in the second interconnection layer 16. This temperature change region 96a becomes a barrier which reduces the velocity of the migration of Al produced in the upper layer 22 of the second interconnection layer 16. Consequently, effects similar to the backflow effect can be imparted to the second interconnection layer 16. Since void progression can thus be suppressed, the increase in interconnection resistance can be prevented and the EM resistance can be improved.

Ninth Embodiment

The interconnection structure 97 according to the ninth embodiment will be explained with reference to FIGS. 14A to 14C.

Figures 14A, 14B, 14C:
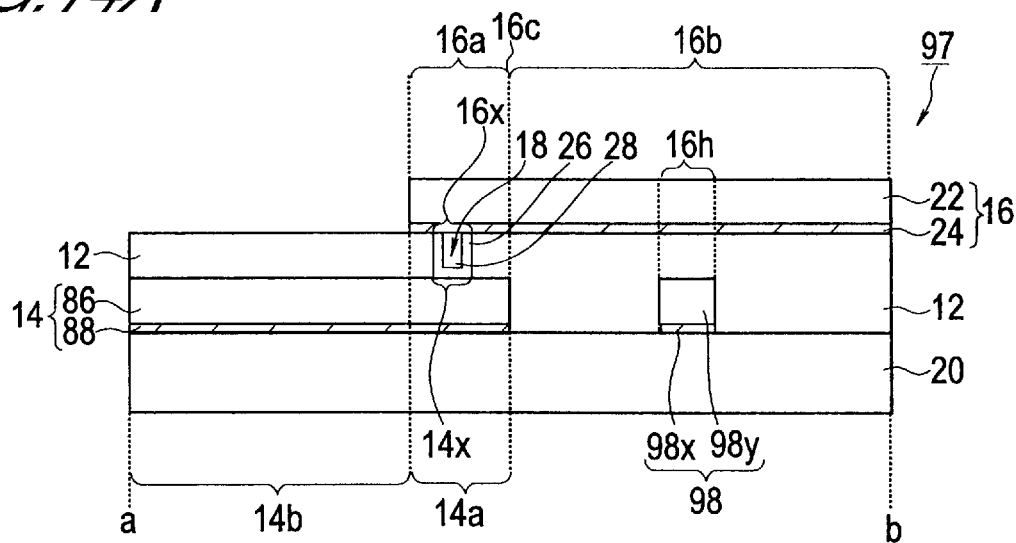
FIG. 14A is a schematic diagram of the constitution of the interconnection structure relating to a ninth embodiment of the present invention in a cross section through a line running along the length of an interconnection layer.
FIG. 14B is a schematic plane view of the constitution of the interconnection layer in the interconnection structure seen from above.
FIG. 14C is a temperature profile along the length of an interconnection layer during use of the interconnection structure relating to the ninth embodiment of the present invention.

FIGS. 14A, 14B and 14C show a diagram, plane view and temperature profile, respectively, which are similar to those shown in FIGS. 13A, 13B and 13C, respectively.

The principal constitution of the interconnection structure 97 is the same as the conventional structure. In FIGS. 14A and 14B, the first interconnection layer 14 is formed on the semiconductor substrate 20. The interlayer insulating film 12 is formed on the semiconductor substrate 20 so as to cover this first interconnection layer 14. The second interconnection layer 16 is formed on the upper surface of the interlayer insulating film 12. The via hole 18, electrically connecting the first interconnection layer 14 and second interconnection layer 16, is formed in the interlayer insulating film 12. In this embodiment, as in the sixth embodiment, the first interconnection layer 14 and second interconnection layer 16 are both layered interconnection of lower layers 88 and 24 comprising TiN film and upper layers 86 and 22 comprising an Al alloy layer. The inner walls of the via hole 18 are covered with the TiN film 26. The surface of the TiN film 26 in the hole 18 is filled with tungsten (W) 28 (FIG. 14A).

In the present embodiment, as in the fifth embodiment, heater line 98 is formed, while being electrically insulated from the first interconnection layer 14 and second interconnection layer 16, at a position on the semiconductor substrate 20 where the heater line 98 can heat the second interconnection layer 16, and that is a position no more than 50 $\mu$m from the edge of the regions 14x and 16x in contact with the via hole 18. The heater line 98 is formed on the substrate 20 as a laminated layer so that the lengthwise direction is perpendicular to the direction along the length of the interconnection (FIG. 14B). In the present embodiment, the region 98b of the heater line 98, excluding the region 98a for conducting heat to the second interconnection layer 16, is formed with the same material as the first interconnection layer 14. In other words, this is a laminated layer of a lower layer 98x comprising TiN film and an upper layer 98y comprising an Al alloy layer. The region 98a for conducting heat to the second interconnection layer is a region comprising only the TiN film 98x with the upper layer removed, and therefore the region 98a comprising only the TiN film 98x of the heater line 98 has an interconnection resistance greater than that of the other region 98b (FIG. 14B). Consequently, current flows in the interconnection structure 97 when voltage is applied to this interconnection structure 97 so that the first interconnection layer 14 and heater line 98 are at a low potential and the second interconnection layer 16 is at a high potential. The interconnection temperature at this time shows the temperature characteristics as in FIG. 14C. The distance along the length of the interconnection on the horizontal axes in FIG. 14C corresponds to the distance from position a to position b in FIG. 14A.

Referring to FIG. 14C, the same temperature distribution as explained with the sixth through eighth embodiments is attained. In other words, the region 14b of the first interconnection layer only and the region 16b of the second interconnection layer only are at low temperatures. Since heat is conducted from the first interconnection layer 14 to the second interconnection layer 16 through the via hole 18, the temperatures rise in a certain extent in the overlap regions 14a and 16a of the first interconnection layer 14 and second interconnection layer 16, even if the first interconnection layer 14 is at a low temperature. The region 98a for conducting heat to the second interconnection layer, of the heater line 98 formed on the lower side of the second interconnection layer 16, is constituted with only the TiN film 98x and becomes a high temperature because of the high interconnection resistance. As a result, the heat generated is conducted to the vicinity of the position where the second interconnection layer 16 is formed (a position no more than 50 $\mu$m from the via hole 18 contact region 16x). Because a region of great temperature change 16h is formed in the second interconnection layer 16, this temperature change region 16h becomes a barrier which reduces the velocity of the migration of Al produced in the upper layer 22 of the second interconnection layer 16. Consequently, effects which are substantially the same as the backflow effect can be imparted to the second interconnection layer 16. Accordingly, the increase in interconnection resistance is prevented because void progression can be suppressed and the EM resistance can be improved.

In the first through ninth embodiments discussed above, the explanation has been made on examples of interconnection structures with two layers of interconnection, but the interconnection structures to which the present invention is applied are not limited thereto and, needless to say, the present invention may also be applied to multilayer interconnection with two or more layers. Also, tungsten (W), TiN, and Al alloys were used as examples of interconnection materials in the embodiments discussed above, but the interconnection is not limited to these materials and the present invention may be applied to materials generally used for semiconductor elements.

What is claimed is:

1. An interconnection structure comprising:

an interlayer insulating film; and first interconnection layer to which a low potential is applied and second interconnection layer to which a high potential is applied, said interlayer insulating film being interposed between said first interconnection and second interconnection layers and said first interconnection and second interconnection layers being electrically connected through a via hole formed through said interlayer insulating film;

wherein overlap regions including regions facing said via hole are formed for both said first interconnection and second interconnection layers;

the shortest distance from the edge of the via hole-faced region to interconnection end in said overlap region of said first interconnection layer is greater than the shortest distance from the edge of the via hole-faced region to interconnection end in said overlap region of said second interconnection layer; and the interconnection resistance of said first interconnection layer is greater than the interconnection resistance of said second interconnection layer.

2. An interconnection structure, according to claim 1, wherein the shortest distance from the edge of the via hole-faced region to the interconnection end in said overlap region of said first interconnection layer is no more than 50 $\mu$m.

3. An interconnection structure, according to claim 1, wherein said first interconnection layer is constituted with metal having a higher melting point than that constituting said second interconnection layer for increasing said interconnection resistance.

4. An interconnection structure, according to claim 1, wherein the width of said first interconnection layer is narrower than the width of said second interconnection layer for increasing said interconnection resistance.

5. An interconnection structure, according to claim 1, wherein said overlap region of said first interconnection layer is constituted with metal having a higher melting point than that of said second interconnection layer for increasing said interconnection resistance.

6. An interconnection structure, according to claim 1, wherein the thickness of said first interconnection layer is thinner than the thickness of said second interconnection layer for increasing said interconnection resistance.

* * * * *